United States Patent

Anderson et al.

[15] 3,656,951

[45] Apr. 18, 1972

[54] PHOTORESIST COMPOSITIONS

[72] Inventors: Richard M. Anderson; Robert A. Heimsch, both of St. Louis, Mo.

[73] Assignee: Monsanto Company, St. Louis, Mo.

[22] Filed: Mar. 2, 1970

[21] Appl. No.: 15,856

[52] U.S. Cl. ..............................96/35.1, 96/115 R, 96/86 P, 96/36.2

[51] Int. Cl. .........................................G03c 1/68, G03c 1/70

[58] Field of Search ........................96/115, 115 P, 35.1, 86 P

[56] References Cited

UNITED STATES PATENTS

| | | | |
|---|---|---|---|
| 3,202,513 | 8/1965 | Thommes | 96/115 |
| 3,135,638 | 6/1964 | Cheney et al. | 96/36.2 |
| 2,758,074 | 8/1956 | Black et al. | 204/15 |
| 2,905,554 | 9/1959 | Fuchsman | 96/115 X |

*Primary Examiner*—Ronald H. Smith
*Attorney*—James W. Williams, Joseph D. Kennedy, Neal E. Willis and Thomas B. Leslie

[57] ABSTRACT

Photosensitive resist compositions comprising an alkene polymer, solvent soluble and solid at ambient temperatures, a photosensitive halogen compound sensitizing agent and a metal organic compound and methods of photomechanical reproduction using such compositions on substrates such as metals, ceramics, glass, and wafers for producing printed circuit boards, integrated circuits, printing plates, chemically milled parts and shapes and the like.

29 Claims, No Drawings

PHOTORESIST COMPOSITIONS

BACKGROUND OF THE INVENTION

The present invention is directed to the art of photomechanical reproduction and to photoresist compositions for use therein.

In the art of photomechanical reproduction used in the production of printing plates, printing cylinders, printed circuit boards, integrated circuits, chemically milled parts and shapes and the decorative arts it is well known to utilize various photoresist materials and compositions to form resist images upon various substrates or supports such as copper, zinc, aluminum, steel, brass, bronze and other metals, upon glass and plastics and upon copper and other metallic clad plastic substrates and super pure metallic wafers such as silicon wafers, germanium wafers and the like. Materials and compositions known and used in the prior art relating to such photomechanical reproduction include bichromated gelatin, bichromated shellac, bichromated polyvinyl alcohol and bichromated polyvinyl butyral as well as polyvinyl cinnamate and related unsaturated ester polymers. All of these prior art materials have suffered from various disadvantages. The bichromated gelatins in addition to being relatively weak, particularly when treated with water solutions of various strong etchants and therefore lacking sufficient strength for the many of such uses, suffer from the common disadvantage of all bichromated materials shared with the bichromated shellacs, bichromated polyvinyl alcohol and polyvinyl butyrals of very limited shelf-life in that the bichromated sensitizer must be separately stored from the polymers and mixed just prior to use. The polyvinyl cinnamate and related unsaturated ester polymers, although forming very strong and resistant films have the disadvantage of poor resistance to alkaline etching and plating baths which results in pronounced "pinholing" and consequent faults in the finished work; hence, in such media these films lack the accuracy in reproduction necessary for extremely fine detailed work. Furthermore, the polyvinyl cinnamate and related polymers are most difficult to strip from their respective substrates with any common organic solvents, requiring excessive times of washing and abrasive rubbing to remove them. This latter often results in damage to the image reproduced on the substrate, or to the substrate itself which cannot be tolerated.

Thus there has been demonstrated a need in the photomechanical reproduction art for a one-package photoresist composition with long shelf-life of improved chemical resistance and fine detail resolution. There has been a particular need for such a photoresist composition which is relatively easy to strip at the desired time from the substrates upon which it is coated with readily available solvents.

SUMMARY OF THE INVENTION

The present invention embraces novel photoresist compositions and novel methods of photomechanical reproduction employing such compositions on a variety of substrates including metallic, ceramic, glass and integrated circuit wafer substrates and including novel processes for producing printed circuit boards, integrated circuits, printing plates, and chemically milled parts and shapes. The photoresist compositions of the invention comprise an alkene polymer solid at ambient temperatures and solvent soluble, a photosensitive halogen compound sensitizing agent, and a metal organic compound.

An object of the invention is provision of photoresist compositions which can be packaged in a single container including the required photoinitiator and which exhibit unique properties. Another object is provision of new photoresist compositions ready for use as they come from the manufacturer requiring no special blending or treatment before use and which permit any type of substrate to be precoated and stored for extended periods before use. A further object is provision of photoresist compositions which can be relatively easily removed from substrates by dipping and washing in readily available solvents.

DETAILED DESCRIPTION OF THE INVENTION

Broadly the photosensitive resist compositions comprise an alkene polymer, a photosensitive halogen compound as a sensitizer and a metal organic compound. The compositions are generally dissolved or dispersed in inert organic solvents for use.

The alkene polymers suitable for use in the novel photoresist compositions will range from soft polymers, which may be oily or waxy in nature, to very hard high polymers and over a wide range of molecular weights from as low as 10,000 to as high as 200,000. The preferred molecular weight for such polymers range from 20,000 to 50,000. Alkene polymers, as employed in this invention, means any polymers possessing ethylenic unsaturation and which are capable of further polymerization or crosslinking by free radicals. These include such homopolymers and copolymers as those of butadiene, isoprene or methylbutadiene, the pentadienes and cyclopentadienes, hexadienes and also diethylenically unsaturated monomers which include a pendant alkene group such as allyl acrylate, methacrylate, fumarate, maleate, malonate and the like, and methallyl acrylate, methacrylate, fumarate, maleate, malonate and the like.

When employing homopolymers of typical dialkene monomers relatively high molecular weight polymers are required for good physical properties in photoresist films formed. However such good physical properties are readily obtained by employing copolymers of the dialkene monomers with copolymerizable monoethylenically unsaturated monomers. Copolymers containing as little as 10 percent of a dialkene monomer in the polymer molecule are useful in the invention. The preferred copolymers are those containing from about 20 to about 80 percent of one or more dialkene monomers in the polymer molecule together with from about 80 to about 20 percent of one or more monoethylenically unsaturated monomers copolymerizable therewith. Copolymers of dialkene monomers with any monoethylenically unsaturated monomers which are copolymerizable therewith can be used. Such copolymerizable monomers useful in the process include styrene, vinyl toluene, acrylonitrile, methacrylonitrile, vinylalkanoates such as vinyl acetate, propionate and the like, vinyl halides such as vinyl chloride, vinyl fluoride, vinyl bromide, vinylidene chloride, acrylic and methacrylic acids, the methacrylates such as methyl methacrylate, ethyl methacrylate and corresponding esters of acrylic and alpha-chloroacrylic acids, acrylonitrile, methacrylonitrile, acrylamides and methacrylamides, acrylimides and methacrylimides, methylvinyl ketone, N-vinylimides, methylene malonic esters, fumarates, maleates, malonates, itaconic acid and itaconic esters, vinyl naphthalene, vinyl pyridines and alkyl substituted vinyl pyridines, vinylimidazoles and alkyl substituted vinylimidazoles and other mono-olefinic copolymerizable monomeric materials.

The sensitizing compounds present in the compositions are halogen compounds which are photosensitive upon exposure to actinic light, i.e., iodine, bromine, and chlorine compounds. Such sensitizing halogen compounds include iodoform, bromoform, chloroform, carbon tetraiodide, carbon tetrabromide, carbon tetrachloride, N-bromosuccinimide, N-iodosuccinimide, hexabromoethane, hexachloroethane, pentabromoethane, pentachloroethane, ethylenedichloride, ethylenedibromide, ethylenediiodide, p-dichlorobenzene, p-dibromobenzene, p-diiodobenzene, iodophenol, diiodophenol, dibromophenol, dichlorophenol, and the like. These halogen photosensitizers are generally employed in amounts of from about 1 to 40 percent of the alkene polymer or copolymer but preferably these halogen sensitizers are present in from about 5 to 20 percent by weight of the alkene polymer.

As a catalyst or accelerator for the photoreaction of the halogen photosensitizers there is employed a metal organic compound. Preferably such compounds are salts of metals with organic acids. Metal cations of the salts include such metals as zinc, copper, tin, cobalt, manganese, cerium, molybdenum, iron, nickel, cadmium, magnesium, lead, silver, calcium and sodium. The organic acids whose metal salts are useful in the present compositions are the higher fatty acids such as oleic, linoleic, octanoic, naphthenic, stearic acids and the like. Also useful are the metallic chelates and enolates, such as the various acetyl acetonates of the above metals, the metal salts of ethylene diamine tetraacetic acid and ferrocene, and the like. The metal salts are present in the compositions in catalytic amounts, usually ranging from about 0.1 to about 10 percent by weight based on the alkene polymer. The preferred range is from about 1 to about 5 percent by weight based on the weight of the alkene polymer.

For use a liquid compositions to be applied to the various substrates the photoresist compositions of the present invention are generally dispersed in inert organic solvents. Any solvent is suitable which does not interfere with the photoreaction of the crosslinking of the alkene polymers. Suitable organic solvents include esters such as propyl acetate, butyl acetate, amyl acetate, isobutylisobutyrate, butyl butyrates, amyl butyrates, mixed butyl-amyl butyrate, ethylene glycol monoethylether acetate and the like, aromatic solvents such as benzene, toluene, xylene, and cumene, and chlorinated solvents such as mono-, di- and trichlorobenzenes, di-, tri- and tetrachloroethylenes, and di-, tri- and tetrachloroethanes, ketones such as methylenethylketone, cyclohexanone, methylisopropyl ketone, methylbutyl ketones, dibutylketones and the like, and nitriles such as acetonitrile, butyronitrile, and the like. Depending on the nature of the alkene polymers different solvents will be used. For the best storage shelf-life esters and ketones are the preferred organic solvents.

The photoresist compositions of the present invention are useful in the production of printing plates, both mono- and bimetallic plates, single and double-sided printed circuit boards, integrated circuits, the chemical milling of metals, and on any other substrates such as glass, ceramics, paper, textiles and polymer films which are treated with resinous photoresist compositions prior to processing by etchants either liquid or gaseous, textile printing, imaging and the like.

The photoresist compositions of the present invention can be coated by any of the known coating methods including spin coating, dip coating, flow coating, spray coating, roller coating and the like. Generally the present photoresist compositions are coated to thicknesses ranging from about 0.1 to 10 microns. The most preferred thickness of coating will depend to some extent on the intended further treatment of the substrate coated with the particular photoresist composition, including the nature of the etchant to be employed and the further plating, soldering or other steps intended to be carried out on the etched substrate. In most cases it is generally preferable to use the present photoresist compositions in coating thicknesses of from about 0.2 to about 5 microns.

Generally the compositions of the present invention can be allowed to dry in air to a sufficient hardness for exposure and further treatment. However, the certain of the less-volatile solvents named above, it is preferred to subject the coated substrates to drying in a convection oven or other type oven with air flow. This can be suitably carried out at times of from 3 to 30 minutes at temperatures ranging from 45° to 65° C. This drying procedure is generally quite sufficient to render the coated polymer film thoroughly dry and sufficiently tough to be subjected to further processing.

The present photoresist compositions can be rendered partially or completely insoluble by exposure to actinic light. Any source of actinic light normally employed for imaging photosensitive compositions are suitable for imaging the present photoresist compositions. Such light sources as pulsed xenon lamps, ultraviolet or black light, mercury vapor lamps, carbon arc, incandescent bulbs or daylight can successfully be used. Because of the speed of exposure it is preferred to use one of the strong sources of light such as those first enumerated above. When incandescent bulbs or daylight is employed a longer exposure is usually required.

With some of the novel photoresist compositions of the present invention it has been found that a post-baking step can be advantageously employed after exposure of the photoresist film to actinic light. With certain of the photosensitive halogen sensitizers and certain of the alkene polymers which are employed the image is insufficiently fully delineated by the actinic light and heat generated by exposure for short periods. In such cases a simple and short post-baking step has been found sufficient to intensify the image for completely successful results. Such a post-baking step can be carried out in any suitable type of oven, including a convection or circulating oven or infrared oven. Successful treatments have ranged from as little as 1 to 3 minutes at 90° C. to longer treatment times of 4 to 8 minutes at 65° C depending upon the nature of the alkene polymer, the halogen photosensitizer and the thickness of the photoresist coating employed. However, for use with many of the present compositions the post-baking step is unnecessary and offers no particular improvement. This is particularly true when the most preferred metal organic compounds are employed in the photoresist composition, such as copper octoate, copper naphthenate, and zinc octoate.

In order to develop the photo image created by exposure to actinic light, the unexposed portions of the coated photo-resist compositions are removed by suitable organic solvents. Such solvents should be chosen so as to afford complete removal after rinsing of the undeveloped portions of the photoresist while at the same time requiring only agitation of the solvent or the coated substrate and avoiding the necessity for abrasion, rubbing or otherwise mechanically removing the undeveloped photoresist polymer. Many types of organic solvents can be used for developing the images, including all those useful as dispersing solvents and detailed above. The most preferred developing solvents are cyclohexane, trichloroethylene, tetrachloroethylene, trichloroethanes, chlorobenzenes, the esters such as propyl, butyl, amyl acetates or butyl butyrates, and the ketones such as methylethylketone, methylbutylketone, cyclohexanone and the like, or aromatic solvents such as xylene, toluene, cumene and the like. Depending upon the particular polymers employed in the photoresist composition, particular developing solvents will be preferred.

The photoresist compositions of the present invention have been found to be useful with all of the common etchants employed in the production of printing plates, printed circuit boards, integrated circuits, chemical milling of metals, etching of glass, accurately printed designs of textiles and paper and other uses on a variety of substrates. Thus, compositions of the present invention are quire suitable for use in the commonly employed copper etchants, such as ferric chloride solutions, chromic acid solutions and alkaline ammonium persulfate solutions. The chromic acid and ammonium persulfate copper etchants are often used to avoid attaching tin/lead solders. The ferric chloride etching solutions of various compositions and strengths are used with copper and brass or bronze printing plates, copper clad printed circuit boards, zinc and aluminum printing plates, copper, brass, carbon steel, stainless steel, spring steel, nickel-iron alloys, such as Kovar, and the like, and other metals and alloys particularly suitable for producing chemically milled parts and shapes. The photoresist compositions can be used in fabricating relatively large-area metal shapes such as aluminum wing spars and panels, stainless steel panels for aircraft and other such shapes produced by chemical milling procedures. Furthermore, the photoresist compositions of the present invention have been found suitable for use with the various etching baths employed in the production of integrated circuit wafers such as polished silicon wafers subjected to etching by hydrofluoric acid and/or phosphoric acid and other similar strong etchants. The etching of glass by means of hydrofluoric acid or other strong etchants can also be successfully carried out with the photoresist compositions of the present invention.

The photoresist compositions have also been found suitable for use on substrates which are intended to undergo further treatments of various types such as plating, soldering, anodizing and the like. For example, in the production of printed circuit boards a variety of subsequent treatments can be used. In some processes a copper-clad board which has been etched to produce the desired circuit pattern and has had the resist covering the pattern removed is thereafter coated with solder which adheres only to the copper circuit pattern. In other procedures a copper laminated board is resist coated, imaged, developed and thereafter plated with additional copper or a different metal with subsequent removal of the resist and etching away of the previously protected copper laminate. The plating is effective only over the metal where the resist has been developed, i.e., dissolved away. When double-sided boards are produced special procedures are required for plating through the holes drilled in the blanks for electrical connections and mountings. Such procedures can involve developing an imaged resist coated copper-clad double-sided board, thereafter plating only the exposed holes and circuit pattern first with copper followed by solder, and then removing the resist and etching away the previously protected original copper laminate with an etchant which does not attack the solder. A variation involves first copper plating a drilled doubled-sided copper laminated board, coating with resist, imaging and developing the desired circuit pattern, thereafter plating with solder in the developed pattern, and then removing the resist and etching away both the original copper laminate and the plated copper except where protected by the solder. Similar multiple resist, imaging, development, plating and etching procedures can be employed for the production of integrated circuit wafers and specialty chemically milled products when desired. The photoresist compositions of the present invention are very well suited for such multiple step procedures due to their excellent chemical resistance and the tough resistant nature of the coated polymer composition.

The storage life of the fully prepared solutions of the present photoresist compositions is quite good. Thus, typical photoresist compositions within the present invention have been stored for periods of up to 6 months in brown glass bottles at 25° C and have been found to be fully effective when thereafter coated, exposed and developed in the usual manner. Likewise, similar solutions of the present photoresist compositions have been stored at elevated temperatures of 45° C for as long as one month and have been found to be fully effective upon subsequent use. It has also been found that copper clad printed circuit board blanks coated with typical photoresist compositions of the present invention can be stored in the absence of light without further precaution for periods of up to 4 weeks or longer and have thereafter demonstrated efficacy in imaging, developing and further processing. Thus the photoresist compositions of the present invention have demonstrated excellent long term shelf-life both in the liquid composition form and when coated upon typical substrates.

The following examples will serve to further illustrate the specific embodiments of the present invention.

EXAMPLE 1

The printed circuit board blanks of commercial usage which have been laminated with copper to a thickness of approximately 1 oz. per square foot, i.e., 1.4 mils upon 1/16 inch thick epoxy board blanks were employed in the following examples herein set forth. The photoresist compositions were prepared by dissolving the indicated weight of the specific alkene copolymer resins in the indicated solvent as set forth in Table I below. To the solution of alkene resin in the solvent there was added the indicated amounts of halogen photosensitizer and, where indicated, the amount of metal organic compound shown and both these materials were stirred until dissolved. When required by the nature of the resin slight heating of the solvent can be employed, but upon complete dissolution of the resin the solution is cooled to room temperature. Generally, no heating above room temperature is required.

The photoresist compositions prepared above were coated upon the copper-clad fiber glass reinforced epoxy printed circuit board blanks by means of spin coating the blanks with the solution of the resin, spinning off excess resin and allowing the blanks to dry while placed flat. Thereafter the coated boards, generally having coatings of from about 1 to 3 microns, while placed in a vacuum frame together with the desired transparency to be photoimaged were exposed for the indicated period to the light of a pulsed xenon lamp. When indicated the boards were thereafter post-baked for from 1 to 3 minutes at 90° C in a convection oven. The printed circuit boards were then developed by dipping and washing while agitating in cyclohexane as developing solvent and then allowed to dry. The boards with the image developed thereon were then etched in aqueous ferric chloride solutions of the indicated Baume strength for the time periods indicated. The etching was carried out in agitated baths. After etching the printed circuit boards were examined under a microscope for degree of resolution, fineness of detail and accuracy of reproduction of the pattern exposed. The boards were then graded visually from 1 to 5, 1 representing an excellent board with fine resolution of detail and complete reproduction of the image, 5 representing a board which was quite poor both in fineness of detail and in failure to reproduce some portion of the image. The results of these tests on the various photoresist compositions tested are set forth in Table I below.

The improvement in the rating of the boards produced when employing the copper octoate metal organic compound is apparent by comparing with run 6 in which none was present.

TABLE I

| Run | Alkene polymer, Solvent | Iodoform, Cu octoate | Exposure time at 30 in. | Post-baked time at 90° C. | Developed time in cyclohexane | Etched 20 min. in $FeCl_3$ | Rating |
|---|---|---|---|---|---|---|---|
| 1 | 2.0 g. S/butadiene,[1] 17.8 g. toluene | 0.20 g., 0.06 g | 2 minutes | 3 minutes | 2 minutes | 40° Baumé | 1 |
| 2 | do | 0.20 g., 0.03 g | do | do | do | do | 1½ |
| 3 | do | 0.20 g., 0.015 g | do | do | do | do | 2½ |
| 4 | do | 0.20 g., 0.03 g | 1 minute | do | do | do | 1½ |
| 5 | do | 0.20 g., 0.06 g | do | do | do | do | 1 |
| 6 | 5.0 g. S/butadiene,[1] 22.3 g. toluene | 0.20 g., None | 2 minutes | do | do | do | 3½ |

[1] 30% styrene 30% butadiene copolymer.

EXAMPLE 2

Similar tests were carried out in the same manner as in Example I above employing the same polymer, iodoform sensitizer and copper octoate, but with the different indicated solvents for the resist compositions. In these tests the effects of varying the photoresist composition upon the thickness of the coating after development in cyclohexane and the effect of the stability of the unexposed portions of the coating to developing solvents as shown by the rating of the etched boards was determined. The results are set out in Table II below.

It is apparent from the data in Table II that a sufficiently solvent-resistant coating must be used to preserve a continuous coating of photoresist in the resist coated areas after development and throughout the etching of the uncoated portions in order that a high quality printed circuit board can be produced. The thickness required will vary with the nature of the alkene polymer used, the amounts and nature of the sensitizer and the metal-organic compounds used as well as the nature and solvent power of the developing solvent employed.

TABLE II

| Run | Alkene polymer,[1] Solvent | Iodoform, Cu octoate | Exposure time at 30 in. | Post-baked time at 90° C. | Coatings, microns before-after devel. | Developed time in cyclohexane | Etched 20 min. in $FeCl_3$ | Rating |
|---|---|---|---|---|---|---|---|---|
| 1 | 0.75 g. S/butadiene, 9.0 g. butyl acetate | 0.04 g. (2.7%), 0.01 g. (1.5%) | 2 minutes | 3 minutes | 0.6–0.26 | 2 minutes | 42° Baumé. | 3 |
| 2 | do | 0.08 g. (5.4%), 0.011 g. (1.5%) | do | do | 0.6–0.38 | do | do | 1 |
| 3 | do | 0.16 g. (10.7%), 0.011 g. (1.5%) | do | do | 0.6–0.31 | do | do | 1 |
| 4 | 10 g. S/butadiene, 89.3 g. n-propyl acetate | 0.5 g., 0.2 g | do | do | 1.82–0.56 | 1 minute | do | 3 |
| 5 | 10 g. S/butadiene, 89.1 g. n-propyl acetate | 0.5 g., 0.4 g | do | do | 1.60–0.31 | do | do | 3½ |
| 6 | 10 g. S/butadiene, 88.7 g. n-propyl acetate | 0.5 g., 0.8 g | do | do | 1.68–0.21 | do | do | 4 |

[1] 70% styrene/30% butadiene coploymer.

acrylonitrile. The procedures for exposure, post-baking, development and etching of the circuit boards were the same as detailed in Example 1 except for such changes as noted in Table III below. Other metal-organic compounds than copper octoate were employed in certain resist compositions where noted. All exposures were made with a pulsed Xenon lamp at 30 inches except when noted as UV; when so noted the exposure was by a fluorescent black light lamp at a distance of 3.5 inches. Where indicated post-baking was carried out in an infrared heated oven rather than the normal convection oven. All developments of the resist were carried out for 2 minutes in a tray with the indicated developing solvents, except as otherwise noted. Various solvents as indicated were employed, both in preparing the photoresist compositions and in developing the imaged circuit boards. The results of the visual grading of the printed circuit boards produced by the various photoresist compositions are set forth in Table III below.

EXAMPLE 3

In this example similar tests to those set forth in Example 1 above were carried out on the same copper-clad epoxy printed circuit blanks but employing photoresist compositions of widely varied types of alkene polymers, including copolymers of butadiene with styrene, varying percentages of acrylonitrile and vinyl toluene, and copolymers of isoprene with

TABLE III

| Run | Alkene polymer | Solvent | $CHI_3$, Cu octoate* | Exposure* time at 30 in. | Post-bake* at 90° C. | Developing solvent | Etched** 20 min. in $FeCl_3$ | Rating |
|---|---|---|---|---|---|---|---|---|
| 1 | 40 g. S/B [1] | 400 g. n-propyl acetate. | 4.0 g., 0.8 g | 2 minutes | 2 minutes | Cyclohexane | 40° Baumé | 1½ |
| 2 | 48 g. VT/B [2] | do | 4.8 g., 0.96 g | do | do | do | do | 1 |
| 3 | do | do | 4.8 g., 1.92 g | do | do | do | do | 1 |
| 4 | do | do | 0.6 g., 0.96 g | do | do | do | do | 1½ |
| 5 | do | do | 9.6 g., 1.92 g | do | do | do | do | 1 |
| 6 | 1.6 g. AN/IP [3] | 18.4 g. n-propyl acetate. | 0.32 g., 0.06 g | 30 seconds | | Toulene | do | 2 |
| 7 | do | do | 0.32 g., 0.12 g | do | | do | do | 1½ |
| 8 | do | do | 0.32 g., 0.12 g. Zn octoate. | do | | do | do | 2 |
| 9 | 3.0 g. AN/IP [3] | 46.4 g. n-propyl acetate. | 0.6 g., 0.12 g | 2 minutes | | do | 42° Baumé | 1 |
| 10 | 1.5 g. AN/IP [3] | 13.5 g. benzene, 9.6 g. n-propyl acetate. | 0.30 g., 0.60 g | do | 3 minutes | do | do | 1 |
| 11 | 8.0 g. AN/IP [3] | 100 g. methyl isobutyl ketone. | 1.6 g., 0.32 g. Zn octoate. | 4 minutes (UV). | 1 minute (IR oven). | Butyl ethyl ketone | 38° Baumé, Spray. | 1 |
| 12 | 7 g. AN/B [4] | 63 g. methyl isobutyl ketone. | 2.1 g., 0.84 g | do | do | do | do | 1 |
| 13 | do | 93 g. methyl isobutyl ketone. | 2.1 g., 0.84 g | do | 3 minutes | do | do | 1 |
| 14 | 5 g. AN/B [5] | 45 g. butyl ethyl ketone. | 1.0 g., 0.40 g | do | do | do | do | 1 |
| 15 | 3 g. AN/B [6] | 27 g. methyl butyl ketone. | 0.6 g., 0.15 g. Zn octoate. | 2 minutes | do | Methyl butyl ketone spray | do | 2 |
| 16 | 5 g. cis B [7] | 45 g. xylene | 1.0 g., 0.2 g. Zn octoate. | do | do | Xylene 30-sec. spray | do | 3 |
| 17 | 5 g. AN/IP [8] | 45 g. methyl butyl ketone. | 1.0 g., 0.2 g | 2 minutes (UV). | | N-propyl acetate | do | 1½ |
| 18 | 5 g. AN/IP [9] | 45 g. methyl butyl ketone. | 1.0 g., 0.2 g | 1 minute | | Methyl butyl ketone | do | 1 |

[1] 70% styrene/30% butadiene copolymer.
[2] 70% vinyl toluene/30% butadiene copolymer.
[3] 34% acrylonitrile/66% isoprene copolymer.
[4] 50% acrylonitrile/50% butadiene copolymer.
[5] 30% acrylonitrile/70% butadiene copolymer.
[6] 42% acrylonitrile/58% butadiene copolymer.
[7] cis-Polybutadiene.
[8] 60% acrylonitrile/40% isoprene copolymer.
[9] 70% acrylonitrile/30% isoprene copolymer.
*Except as otherwise noted.
**Spray—Etched 2 min. in conveyorized spray etcher with 38 Bé. $FeCl_3$.

EXAMPLE 4

In this Example certain of the compositions set forth above were analyzed for line fidelity and resolution in comparison to the printed circuit master transparency reproduced. The results, set out in Table IV below, are stated as measurements of widths of both fine and heavy lines from the master and their reproduction in copper on the circuit boards, with the difference in widths stated in millimeters. The finished printed circuit board from Run 7 of Example 3 was used, that employing a photoresist composition composed of a 34 percent acrylonitrile/66 percent isoprene copolymer in n-propyl acetate solvent. The finished board was examined at 5 separate points around the board and reproduced lines were measured in comparison with the lines at the same points on the master. In all cases, as expected, the lines reproduced in copper were slightly wider than those of the master and this is to be expected due to the optical effect of exposure through the master. These results demonstrate the absence of over-etching and under-cutting of the etched copper lines with a photoresist composition of the present invention.

TABLE IV

| Position | Line Character | Widths in mm Board Run 7 | Master | Δ in mm |
|---|---|---|---|---|
| 1 | Fine—lower left | 0.11 | 0.08 | 0.03 |
| 2 | Fine—upper center | 0.10 | 0.09 | 0.01 |
| 3 | Fine—right center | 0.11 | 0.10 | 0.01 |
| 4 | Wide—left center | 0.64 | 0.56 | 0.08 |
| 5 | Wide—center | 0.61 | 0.56 | 0.05 |

EXAMPLE 5

In this example similar tests to those set forth in Example 1 were carried out on the same copper-clad epoxy board blanks with photoresist compositions in which the photosensitive halogen compound sensitizer was widely varied. The photoresist compositions were basically 10 to 12 percent solutions of a 70 percent Vinyl toluene/30 percent butadiene copolymer in n-butyl acetate with the indicated percentages of halogen compound sensitizer and metal organic compound based on the weight of the copolymer used in each run. The procedures for coating, exposing, post-baking, developing, and etching the boards were the same as detailed in Example 1 except for such changes as noted in Table V below in which are set out the results of rating the boards.

EXAMPLE 6

In the following Example similar tests to the above were carried out on copper-clad epoxy printed circuit blanks to illustrate the percent of film thickness retained upon exposure and development. The alkene copolymer employed a solution of a copolymer of 34 percent acrylonitrile and 66 percent isoprene dissolved in n-propyl acetate. This solution also contained 20 iodoform and 4 percent copper octoate based on the weight of polymer. The printed circuit board blanks were spin coated, air dried and the film thickness determined. Thereafter the boards were exposed for the indicated times through a printed circuit master transparency to a pulsed Xenon lamp at 30 inches, developed by washing 2 minutes in toluene and the film thickness of an exposed portion determined. The results are set out in Table VI below.

TABLE VI

| Run | Exposure | Film Before Devel. | Film After Devel. | % Thickness Retained |
|---|---|---|---|---|
| 1 | 4 mins. | 1.25 | 1.03 | 82.4 |
| 2 | 2 mins. | 1.25 | 0.98 | 78.4 |
| 3 | 1 min. | 1.25 | 0.78 | 62.4 |
| 4 | 30 secs. | 1.25 | 0.66 | 52.8 |
| 5 | 0 secs. | 1.25 | 0.17 | 13.6 |

EXAMPLE 7

In the following Example similar tests as detailed in Example 1 above were carried out on copper-clad printed board blanks employing photoresist compositions in which the metal organic compound was varied extensively employing approximately the same weight of metal ion in each run. All the metal organic compounds set forth in Table VII below were added in the indicated percentages based on the weight of a 70 percent vinyl toluene and 30 percent butadiene copolymer dissolved in propyl acetate to form a 12.5 percent solution and the compositions also contained 15 percent of iodoform by weight of polymer as sensitizer. The boards were exposed for the indicated times to either a fluorescent black light ultraviolet lamp or a pulsed Xenon lamp and were thereafter post-baked in a convection oven for 3 minutes and developed by washing for 2 minutes in cyclohexane as developing solvent. After etching in 42° Baume ferric chloride for 20 minutes in rocker trays the finished boards were visually rated in the same manner as in Example 1 above. The results reported in Table VII below may be compared to a control test in which no metal organic compound was used and the pattern was essentially all removed by the development in cyclohexane.

TABLE V

| Run | Sensitizer, Me Compound | Exposure,[1] time/ Distance | Post-baked at 90° C. | Developed 2 min. in solvent | Etched [2] in $FeCl_3$ | Rating |
|---|---|---|---|---|---|---|
| 1 | 10% $CHI_3$, 2.4% Cu octoate | 2 min. PX, 30 in | 2 minutes | Cyclohexane | 40° Beumé, 20 min | 1 |
| 2 | 20% n-bromo-succinimide, 4% Zn octoate | 1 min. MVL, 4 in | 3 minutes | Trichloroethane | do | 1½ |
| 3 | 20% n-bromo-succinimide, 4% Sn octoate | 15 min. MVL, 18 in | do | Cyclohexane | 38° Beumé, Spray | 1 |
| 4 | 20% $CBr_4$, 4% Sn octoate | do | do | do | do | 1 |
| 5 | 20% penta-bromophenol, 4% Sn octoate | 10 min. MVL, 18 in | | do | do | 1 |

[1] PX=Pulsed Xenon Lamp at 30 in.
MVL=Mercury Vapor Lamp at 4 or 18 in.
[2] 20 min. was etched in rocker tray; Spray was 2 min. in conveyorized spray etcher.

TABLE VII

| Run | Metal organic compound | Percent by wt. | Exposure Light | Exposure Min. | Rating |
|---|---|---|---|---|---|
| Control | None | | PX | 2 | [1] 4½ |
| 1 | Cu octoate | 4 | PX | 2 | 1 |
| 2 | do | 4 | UX | 2 | 1 |
| 3 | Ni octoate | 9 | PX | 1 | 1½ |
| 4 | Zn octoate | 3 | UV | 2 | 1 |
| 5 | do | 4 | UV | 1 | 1 |
| 6 | Fe octoate | 9 | UV | 3 | 2 |
| 7 | do | 9 | PX | 1 | 1 |
| 8 | Ce octoate | 11.3, | UV | 2 | 1 |
| 9 | do | 9 | PX | 1 | 1½ |
| 10 | Mn octoate | 9 | PX | 1 | 1 |
| 11 | do | 11.3 | UV | 2 | 1 |
| 12 | Ca octoate | 12 | PX | 2 | 1 |
| 13 | Pb octoate | 3 | PX | 1 | 1 |
| 14 | Cr octoate | 9 | PX | 2 | 1½ |
| 15 | Cd octoate | 4.5 | PX | 1 | 1 |
| 16 | Co octoate | 6 | UV | 1 | 1 |
| 17 | do | 9 | PX | 1 | 1 |
| 18 | Mo octoate | 9 | UV | 2 | 1 |
| 19 | do | 9 | PX | 1 | 1 |
| 20 | Va naphthenate | 12 | PX | 2 | 1½ |
| 21 | Mo naphthenate | 18 | PX | 1 | 1½ |
| 22 | Mn naphthenate | 6 | PX | 1 | 1 |
| 23 | do | 6.9 | UV | 2 | 1 |
| 24 | Mg naphthenate | 12 | PX | 1 | 1 |
| 25 | Zn naphthenate | 19 | UV | 1 | 1 |
| 26 | do | 7 | PX | 1 | 1½ |
| 27 | Co naphthenate | 12 | UV | 1 | 1 |
| 28 | Sodium oleate | 12 | PX | 2 | 1 |
| 29 | Ferrocene | 3 | PX | 2 | 3 |
| 30 | Zn octoate/Mn octoate | 4 | UV | ½ | 1½ |
| 31 | Zn octoate/Ce octoate | 4 | UV | 1½ | 2 |
| 32 | Zn octoate/Co octoate | 4 | UV | ½ | 1½ |
| 33 | Zn octoate/Zn naphthenate | 4 | UV | ½ | 2 |
| 34 | Zn octoate | 4 | UV | ½ | 1½ |
| 35 | Zn acetylacetonate | 2 | PX | 1 | 1 |
| 36 | Co acetylacetonate | 1.5 | PX | 2 | 2½ |
| 37 | Ce acetylacetonate | 2 | PX | 1 | 1½ |
| 38 | Mn acetylacetonate | 3 | PX | 2 | 1½ |

[1] Pattern essen. removed.

EXAMPLE 8

In the following example the ability of the photoresist compositions of the present invention to withstand electroplating conditions was demonstrated. As set out below, clean copper-laminated printed circuit board blanks were very thoroughly cleaned with organic solvents, pumice, dilute sodium hydroxide, dilute acetic acid and water. When dried they were whirl-coated with a 12.5 percent solution of 70 percent vinyl toluene/30 percent butadiene copolymer in n-propyl acetate containing the indicated percentages of iodoform and copper octoate based on the weight of the polymer. The dried coated boards were exposed for 2 minutes to a master transparency of a printed circuit by a pulsed xenon lamp at 30 inches. Thereafter they were developed by a 2 minute agitated wash in cyclohexane. The imaged boards were recleaned by dipping in 15 percent hydrochloric acid, dipping for 25 seconds in dilute ammonium persulfate and then again in the HCl for 15 seconds. They were then electroplated by attaching them as the anode in a standard copper pyrophosphate plating bath for 28 minutes at a current flow of 40 amperes/hour. After removal from the bath the photoresist was removed by washing in triclene or chloroform and the quality of the overplated circuit pattern visually rated using the same system as used for the results of etching. All the boards reproduced the pattern to an acceptable level as shown in Table VIII below.

TABLE VIII

| Run | % $CHI_3$ | % Cu Octoate | Rating |
|---|---|---|---|
| 1 | 10 | 2 | 2 |
| 2 | 20 | 2 | 2 |
| 3 | 10 | 4 | 2 |
| 4 | 20 | 4 | 2 |

EXAMPLE 9

In the following example printing plates of various metals were whirl coated with a photoresist composition of a 12.5 percent solution of a 70 percent vinyl toluene 30 percent butadiene copolymer containing dissolved 20 percent of iodoform and 4 percent of copper octoate based on the polymer. After drying the plates were exposed to a photographic negative as noted below, post-baked for 3 minutes at 90° C and developed by a 2 minute agitated wash in trichloroethane. After drying at 90° C for 3 minutes the plates were etched in a conveyorized spray etcher for a 2 minute total etching time with 42° Baume ferric chloride solution. Each of the plates showed an excellent reproduction of the respective photographic images and was suitable for reproducing copies thereof by letter press printing. The several runs are summarized in Table IX below.

TABLE IX

| Run | Printing Plate | Exposure | Results |
|---|---|---|---|
| 1 | Copper Letterpress | 5 min. UV at 3.5 in. | Good Relief Image |
| 2 | Magnesium | 5 min. UV at 3.5 in. | Good Relief Image, Fast Etch |
| 3 | Aluminum | 2 min. P-X at 30 in. | Good Relief Image |

EXAMPLE 10

The usefulness of the present photoresist compositions in chemical milling of metals is demonstrated in this example. Several examples of typical chemically milled metals in the form of shim stock were thoroughly cleaned by dipping in trichloroethylene and then exposed to trichloroethylene vapor in a vapor degreaser for one minute. The samples of shim stock were then coated on both sides in a dip coater with a photoresist composition comprising a 10 or 12.5 percent solution of 70 percent vinyl toluene/30 percent butadiene copolymer containing dissolved 20 percent of iodoform and 4 percent of copper octoate based on the weight of the polymer and air dried. The dried coated shim stock was exposed to the desired pattern to be chemically milled under an ultraviolet lamp at 3.5 inches for 5 minutes and post-baked for 3 minutes at 90° C. The photoresist was developed by washing for 2 minutes in cyclohexane and dried for 3 minutes at 90° C. The shim stock with developed resist was etched in a conveyorized spray etcher with 42° Baume ferric chloride so that etching took place from both sides of the stock. After rinsing the chemically milled samples were visually graded for fidelity to the pattern exposed, registry from each side and uniformity of fine lines etched. The results are set out in Table X below.

TABLE X

| Run | % Polymer Solution | Metal | Thickness | Rating |
|---|---|---|---|---|
| 1 | 12.5% | Brass | 0.004 | 1 |
| 2 | 12.5% | Brass | 0.006 | 1 |
| 3 | 12.5% | Kovar[1] | 0.005 | 2 |
| 4 | 12.5% | CR Steel[2] | 0.015 | 3 |
| 5 | 12.5% | CR Steel[2] | 0.008 | 3 |
| 6 | 10.0% | Brass | 0.012 | 2 |
| 7 | 10.0% | Kovar[1] | 0.005 | 2 |
| 8 | 10.0% | CR Steel[2] | 0.010 | 3 |
| 9 | 10.0% | Blue Steel | 0.015 | 3 |
| 10 | 10.0% | Stainless Steel[3] | 0.006 | 3 |

[1] Nickel-iron alloy

[2] Cold rolled steel

[3] Type 316 stainless steel

EXAMPLE 11

This example demonstrates the ability of the photoresist compositions of this invention to be employed with powerful etchants. An oxidized silicon wafer was very thoroughly cleaned by washing with trichloroethane, dilute sodium hydroxide solution and deionized water. It was then whirl coated with a photoresist composition of a 12.5 percent solution of 70 percent vinyl toluene/30 percent butadiene copolymer in n-propyl acetate containing 20 percent iodoform and 4 percent copper octoate based on the weight of the polymer. The dried coated wafer was exposed to an integrated circuit mask under a pulsed xenon lamp at 30 inches for 2 minutes and then post-baked for 3 minutes at 90° C. The resist was developed by agitated washing with cyclohexane for 2 minutes. The wafer was then etched in a tray with a standard ammonium fluoride-hydrofluoric acid etchant for 3 minutes and the resist removed by washing in chloroform. The integrated circuit pattern was faithfully reproduced in the etched wafer which was suitable for doping, sectioning and use as an integrated circuit component.

The photoresist and etching procedure above was repeated by exposing a coated glass plate to a photographic negative. As a result of etching for 3 minutes with the ammonium fluoride-hydrofluoric acid etchant the photographic image was reproduced in relief etched into the glass plate.

We claim:

1. A photosensitive resist composition consisting essentially of (1) and alkene polymer which is solvent soluble and solid at ambient temperatures and is an ethylenically unsaturated polymer of diethylenically unsaturated monomer, (2) an organic halogen compound sensitizing agent sensitive to actinic light, and (3) a metal organic compound selected from the group consisting of salts of higher fatty acids, chelates and enolates of zinc, copper, tin, cobalt, manganese, sodium, magnesium, potassium, calcium, iron, nickel, molybdenum, silver, cadmium, cesium and lead.

2. The photosensitive resist composition of claim 1 dissolved in an inert organic solvent.

3. The photosensitive resist composition of claim 1 in which said alkene polymer is selected from the group consisting of a homopolymer of butadiene, isoprene, a pentadiene, a cyclopentadiene, a hexadiene, an alkene substituted acrylate, methacrylate, fumarate, maleate or malonate and copolymers thereof with copolymerizable monoethylenically unsaturated monomers.

4. The photosensitive resist composition of claim 1 in which the alkene polymer is a copolymer of acrylonitrile and isoprene.

5. The photosensitive resist composition of claim 1 in which the alkene polymer is a copolymer of acrylonitrile and butadiene.

6. The photosensitive resist composition of claim 1 in which the alkene polymer is a copolymer of vinyl toluene and butadiene.

7. The photosensitive resist composition of claim 1 in which the alkene polymer is a copolymer of allyl fumarate and styrene.

8. The photosensitive resist composition of claim 1 in which the halogen compound sensitizing agent is iodoform.

9. The photosensitive resist composition of claim 1 in which the halogen compound sensitizing agent is carbon tetrabromide.

10. The photosensitive resist composition of claim 1 in which the halogen compound sensitizing agent is n-bromosuccinimide.

11. The photosensitive resist composition of claim 1 in which the halogen compound sensitizing agent is pentabromophenol.

12. The photosensitive resist composition of claim 1 in which the metal organic compound is copper octoate.

13. Photosensitive imaging means comprising a support having coated thereon a photoresist composition consisting essentially of an alkene polymer which is solvent soluble and solid at ambient temperatures and is an ethylenically unsaturated polymer of diethylenically unsaturated monomer, an organic halogen compound sensitizing agent sensitive to actinic light and a metal organic compound selected from the group consisting of salts of higher fatty acids, enolates and chelates of zinc, copper, tin, cobalt, manganese, sodium, magnesium, potassium, calcium, iron, nickel, molybdenum, silver, cadmium, cesium and lead.

14. Photosensitive imaging means of claim 13 in which the support is a metal-clad printed circuit board blank.

15. Photosensitive imaging means of claim 13 in which the support is a metal chemical milling blank.

16. Photosensitive imaging means of claim 13 in which the support is a metal printing plate blank.

17. Photosensitive imaging means of claim 13 in which the support is an integrated circuit wafer.

18. A method of photoimaging comprising the steps of:

a. applying to a surface of a support a composition consisting essentially of an alkene polymer which is solvent soluble and solid at ambient temperatures and is an ethylenically unsaturated polymer of diethylenically unsaturated monomer, an organic halogen compound sensitizing agent sensitive to actinic light, a metal organic compound selected from the group consisting of salts of higher fatty acids, chelates and enolates of zinc, copper, tin, cobalt, manganese, sodium, magnesium, potassium, calcium, iron, nickel, molybdenum, silver, cadmium, cesium and lead,
b. placing a mask in cooperative relationship with respect to said composition,
c. exposing said mask and composition to actinic light,
d. removing said mask, and
e. removing the unexposed portions of said composition from said surface.

19. The method of photoimaging of claim 18 wherein the support is a metal chemical milling blank and after the removal of the unexposed portions of the composition in step (e), the uncovered portions of said metal blank are etched away to the degree desired.

20. The method of photoimaging of claim 19 wherein the metal blank support is coated on both surfaces by step (a) and the etching away of the uncovered portions of said metal blank is carried out simultaneously on both of the surfaces thereof.

21. The method of photoimaging of claim 18 wherein the support is a metal printing plate blank and after the removal of the unexposed portions of the composition in step (e), the uncovered portions of said plate blank are etched to produce a printing plate.

22. The method of photoimaging of claim 18 wherein the support is a metallic integrated circuit wafer and after the removal of the unexposed portions of the composition in step (e), the uncovered portions of said wafer are etched away to the degree desired.

23. The method of photoimaging of claim 18 wherein the support is a glass shape and after removal of the unexposed portions of the composition in step (e), the uncovered portions of said glass shape are etched away to the degree desired.

24. A method of making a printed circuit board comprising the steps of:

a. applying to a surface of a metal-clad printed circuit board blank a composition consisting essentially of an alkene polymer which is solvent soluble and solid in ambient temperatures and is an ethylenically unsaturated polymer of diethylenically unsaturated monomer, an organic halogen compound sensitizing agent sensitive to actinic light, a metal organic compound selected from the group consisting of salts of higher fatty acids, chelates and enolates of zinc, copper, tin, cobalt, manganese, sodium, magnesium, potassium, calcium, iron, nickel, molybdenum, silver, cadmium, cesium and lead.
b. placing a mask in cooperative relationship with respect to said composition,
c. exposing said mask to actinic light,
d. removing said mask,
e. removing the unexposed portion of said composition from said surface, f. etching away the uncovered portions of said metal surface, and g. removing the remaining portion of said composition from said board.

25. The method of making a printed circuit board of claim 24 in which after the etching in step (f), the board is plated with a metal or coated with an alloy before removing the remaining portion of said composition.

26. The method of making a printed circuit board of claim 24 in which after the removal of the unexposed portion of said composition from said surface in step (e) the surface is plated with a metal or coated with an alloy before the etching of step (f).

27. The method of making a printed circuit board of claim 26 in which the printed circuit board blank is metal-clad on both surfaces, step (a) is carried out on both said surfaces, and steps (b), (c), and (d) are carried out separately on each of said surfaces.

28. The process of claim 18, in which the halogen compound is a halogen containing alkane.

29. The process of claim 18 in which the halogen compound is a halogen containing phenol.

* * * * *

PO-1050
(5/69)

UNITED STATES PATENT OFFICE
CERTIFICATE OF CORRECTION

Patent No. 3,656,951 Dated April 18, 1972

Inventor(s) Richard M. Anderson et al -1-

It is certified that error appears in the above-identified patent and that said Letters Patent are hereby corrected as shown below:

In the Specification:

Column 3, line 17, "tion of the crosslinking" should read --- tion or the crosslinking ---.
See specification, page 6, line 22.

Column 3, line 26, "such as methylenethylketone," should read --- such as methylethylketone, ---.
See specification, page 6, line 30.

Columns 5 and 6, Table I, the footnote "[1] 30% styrene 30% butadiene copolymer." should read --- [1] 70% styrene 30% butadiene copolymer. ---.
See specification, page 14.

Columns 7 and 8, Table III, fourth item under $\underline{CHI_3, \text{ Cu octoate}}$, "0.6 g., 0.96 g." should read --- 9.6 g., 0.96 g. ---.
See specification, page 18

Columns 9 and 10, Table V, first and third items under $\underline{\text{Etched}^2 \text{ in } FeCl_3}$, "Beume" should read --- Baume ---.
See specification, page 21.

Column 10, lines 8 and 9, "also contained 20 iodoform" should read --- also contained 20 percent iodoform ---.
See specification, page 22, line 7.

Column 11, Table VII, third item under <u>Light</u> "UX" should read --- UV ---.
See specification, page 24.

PO-1050
(5/69)

UNITED STATES PATENT OFFICE
CERTIFICATE OF CORRECTION

Patent No. 3,656,951 Dated April 18, 1972

Inventor(s) Richard M. Anderson et al

It is certified that error appears in the above-identified patent and that said Letters Patent are hereby corrected as shown below:

Column 11, lines 74 and 75, "based on the polymer." should read --- based on the weight of the polymer. --- See specification, page 27, line 6.

Signed and sealed this 6th day of February 1973.

(SEAL)
Attest:

EDWARD M.FLETCHER,JR.
Attesting Officer

ROBERT GOTTSCHALK
Commissioner of Patents